United States Patent [19]

Limberg

[11] 3,891,935

[45] June 24, 1975

[54] TRANSISTOR BIASING ARRANGEMENT

[75] Inventor: Allen Leroy Limberg, Lambertville, N.J.

[73] Assignee: RCA Corporation, New York, N.Y.

[22] Filed: Sept. 21, 1973

[21] Appl. No.: 399,486

[52] U.S. Cl. ...................... 330/22; 330/19; 330/28; 330/30 D; 330/40

[51] Int. Cl. ...................... H03f

[58] Field of Search..... 330/19, 27, 28, 30 D, 38 M, 330/40

[56] References Cited

UNITED STATES PATENTS

| | | | |
|---|---|---|---|
| 3,477,030 | 11/1969 | Hawkins | 330/22 X |
| 3,699,464 | 10/1972 | Zobel | 330/30 D X |
| R27,351 | 5/1972 | McGraw et al. | 330/30 D |

*Primary Examiner*—Rudolph V. Rolinec
*Assistant Examiner*—Lawrence J. Dahl
*Attorney, Agent, or Firm*—H. Christoffersen; S. Cohen

[57] ABSTRACT

A first biasing transistor has at least a portion of its base current supplied by the emitter current of a second biasing transistor. The collector current of the first transistor is larger than the collector current of the second transistor by a factor proportional to the $h_{fe}$ current gain characteristic of the first transistor. The collector current of the first transistor is used to establish the quiescent collector-to-emitter current flow of an amplifier transistor having an $h_{fe}$ which matches that of the first biasing transistor. The collector current of the second transistor is used to establish the level quiescent base current supplied to the amplifier for supporting the latter quiescent collector-to-emitter current flow. This avoids quiescent base current drain from the circuitry providing input signal to the amplifier transistor.

25 Claims, 7 Drawing Figures

TRANSISTOR BIASING ARRANGEMENT

The present invention relates to a translation network for providing a current in known proportion to the base current of a transistor.

A recurring problem in a transistor circuit design is to provide stable biasing of a transistor from a high-impedance current source without having to rely upon degenerative feedback methods. Practically speaking, this problem was never solved until close tracking of transistor characteristics was made available by monolithic integrated circuitry technology. A basic solution to the problem was set forth by A. A. A. Ahmed in U.S. Pat. application Ser. No. 302,866 filed Nov. 1, 1972; entitled "Stabilization of Quiescent Collector Potential of Current-Mode Biased Transistors" and assigned, like the present application, to RCA Corporation. That application teaches the application of base and collector currents related in the ratio $1:h_{fe}$ to an amplifier transistor, where $h_{fe}$ is the common-emitter forward current gain of the amplifier transistor and the ratio is determined by means external to the amplifier transistor. The base biasing of the amplifier transistor from a relatively high impedance current source does not lower the inherent input impedance at the base electrode of the amplifier transistor, and its collector electrode quiescent potential—that is, the amplifier "operating point"—is stably determined by the subsequent circuitry.

A problem in the design of differential amplifiers using emitter-coupled transistors is the uncertainty of quiescent output signal level. Such uncertainty can be introduced by the base currents of the transistors varying in level inversely proportionally to the common-emitter forward current gains ($h_{fe}$'s) of the transistors. Input offset potential errors are developed in response to these base current variations in the resistor networks used for base-biasing. This problem has been solved in U.S. Pat. No. 3,551,832 and No. 3,717,821 in the following way. The collector current of one or both of the differential amplifier transistors is sensed with a sensing transistor. The base current of the sensing transistor is then coupled by a translating network to the base electrode of one or each of the differential-amplifier transistors to supply its quiescent base current demands. It would be desirable however, to be able to perform the desired compensation without introducing a sensing transistor into the collector circuitry of the differential amplifier transistors since its presence reduces the available signal swing in that circuitry.

The present inventin is embodied in the following type of circuit. A first biasing transistor has at least a portion of its base current supplied by the emitter (or source) current of a second biasing transistor. The collector current of the first biasing transistor is coupled to the collector-to-emitter path of an amplifier transistor thereby to establish the quiescent emitter-to-collector current through the amplifier, and the collector (or drain) current of the second biasing transistor is employed to establish the quiescent bias current applied to the amplifier.

Figure 1:
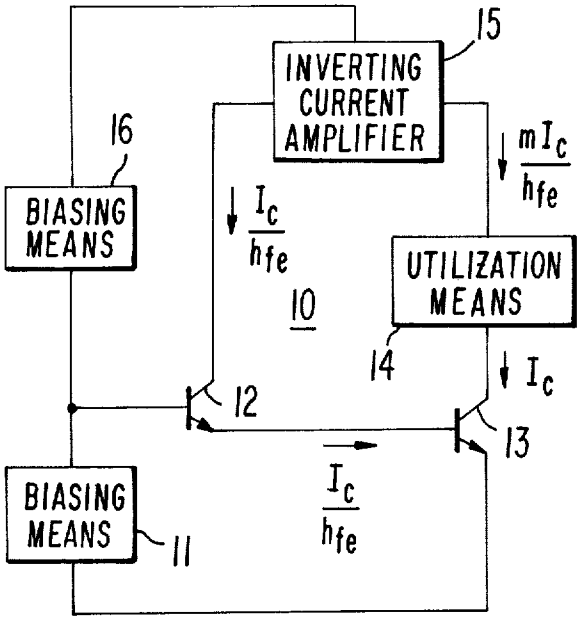
FIGS. 1 and 2 are schematic diagrams, partially in block form, of translation networks embodying the present invention.

In configuration 10 of FIG. 1, biasing means 11 applies forward bias to the serially connected base emitter junctions of transistors 12 and 13, causing a collector current $I_C$ to be withdrawn from utilization means 14 via the collector-to-emitter path of transistor 13. By fundamental transistor action, the base current of transistor 13 is smaller than its collector current $I_C$ by a factor equal to its common-emitter amplifier current gain $h_{fe}$—sometimes referred to as "beta."

It is desired to derive a current of opposite sense to the collector current $I_C$ of transistor 13, and in fixed proportion $m$ to the base current $I_C/h_{fe}$ of transistor 13. This derived current should be provided for application to the utilization means 14 from a source capable of being biased to a more positive potential than the collector electrode of transistor 13, assuming transistors 12 and 13 to by NPN transistors, as shown, or to a more negative potential were they PNP transistors.

This desired end is the reason for including the base-emitter junction of transistor 12 in series with the base-emitter junction of transistor 13 for application of forward bias by the biasing means 11. The current $I_C/h_{fe}$ can be obtained at the base electrode of transistor 13 only at one potential, as referred to its emitter potential, or the forward biasing of its base-emitter junction will be disturbed. This limitation is overcome in the following manner.

The base current of transistor 13 is amplified by the substantially unity gain of the common-base amplifier action of transistor 12 to provide a collector current of a magnitude substantially equal to the magnitude of the base current of transistor 13—that is, of a value $I_C/h_{fe}$. Because of the "infinite"-resistance collector-resistance characteristic of a transistor, the collector electrode of transistor 12 may be referred to a wide range of potentials without substantially affecting its collector current flow or disturbing the biasing of the base-emitter junction of transistor 13. The collector electrode of transistor 12 need only be biased more positively than its base electrode, but not so much as to exceed its collector-to-base and collector-to-emitter breakdown potentials.

The collector current of transistor 12 is withdrawn from the input circuit of a current amplifier 15. This amplifier has a current gain $-m$, and therefore, in response to the $I_C/h_{fe}$ collector current of transistor 12, it supplies an output current of value $mI_C/h_{fe}$ to the utilization means 14. Because of the freedom permitted in the biasing of the collector electrode of transistor 12, biasing means 16 can be used to bias the entire current amplifier 15 more positively than the collector electrodes of transistors 12 and 13. This ensures normal reverse-biasing of the collector-base junction of these transistors and at the same time provides the current $mI_C/h_{fe}$ at the potential previously indicated to be desirable for application to the utilization means 14.

The current amplifier 15 may include two transistors and is generally of the type where one of these transistors (a PNP transistor for the circuit shown) has its base-emitter potential adjusted by collector-to-base degenerative feedback so its collector current flow is substantially equal to the $I_C/h_{fe}$ collector current demanded by transistor 12. The base-emitter potential of this first transistor is coupled to the base-emitter junction of the second transistor. The second transistor has base-emitter circuitry with conductance $m$ times as large as the conductance of the base-emitter circuitry of the first component transistor. The collector current of the second transistor is then $m$ times as large as that of the first transistor, and $m$ is independent of the $h_{fe}$'s of the transistors used in the current amplifier.

Figure 3:
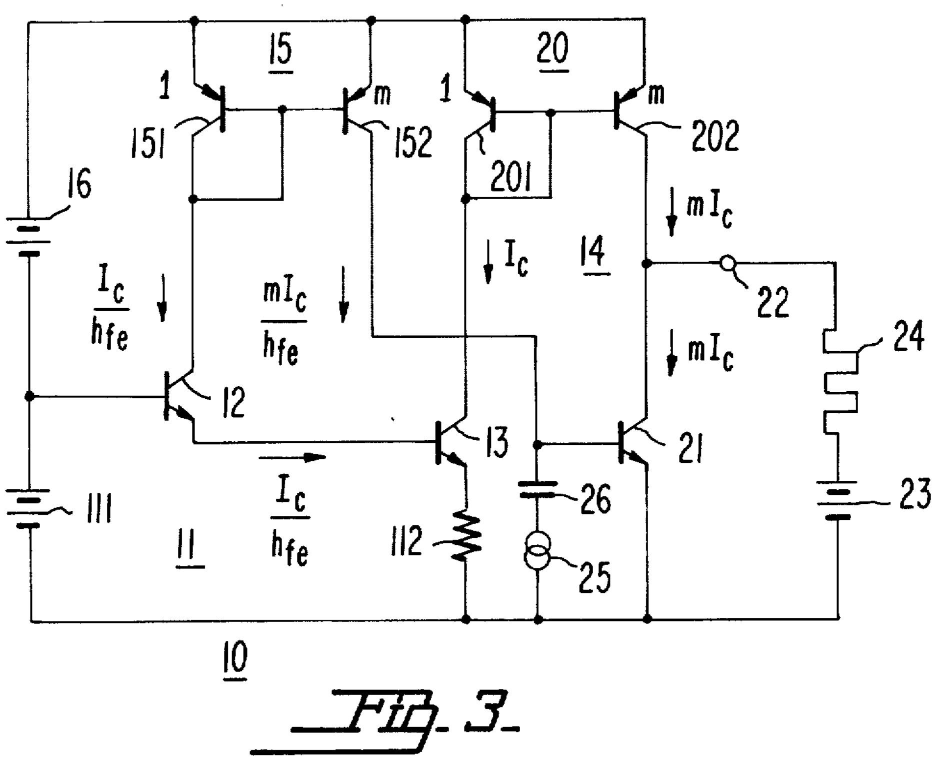
FIG. 3 is a schematic diagram showing apparatus using the FIG. 1 translation network to carry out the teaching of Dr. Ahmed in an improved way.

Many such current amplifiers are known. One, by way of example, is shown in FIG. 3 as comprising first and second component transistors 151 and 152, respectively. Other suitable types of current amplifiers are described in: U.S. Pat. No. 3,588,672; Technical Note 914, a publication of RCA Corporation; U.S. Pat. application Ser. No. 318,645 filed Dec. 26, 1972 in the name of H. A. Wittlinger and U.S. Pat. application Ser. No. 348,723 filed Apr. 6, 1973 in the name of A. A. A. Ahmed, each of which applications is entitled "CURRENT AMPLIFIER" and is assigned, like the present application, to RCA Corporation. Current amplifiers of a similar sort but using field-effect transistors are also known, and current amplifier 15 may also alternatively be of such a type.

Figure 2:
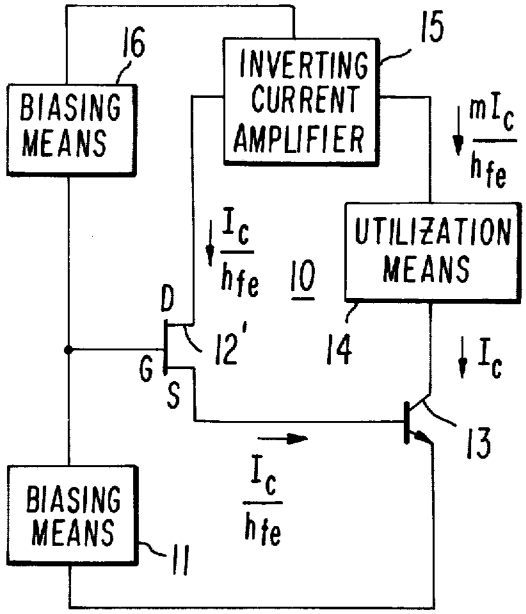

Transistor 12, while shown in FIG. 1 as being a bipolar transistor, may alternatively be a field-effect transistor as shown in FIG. 2. Field-effect transistor 12' in FIG. 2 has its gate, source and drain electrodes connected in correspondence with the base, emitter and collector electrodes of the bipolar transistor 12 of FIG. 1. Field-effect transistor 12' may be of any type, e.g., junction, insulated-gate or metal oxide semiconductor. The principal conductive path of transistor 12' connects the base electrode of transistor 13 to the input circuit of the inverting current amplifier.

The conductance of this principal conduction path is determined in response to potential appearing between its control (e.g., base or gate) electrode and its electrode connected to the base electrode of transistor 13. This causes the potential of this electrode connected to the base electrode of transistor 13 to follow the potential at the control electrode. The control electrode of transistor 12 is connected to determine by means of potential follower action the base bias potential applied to transistor 13. This potential-follower action is emitter-follower action if a bipolar transistor 12 be used and source-follower action of field-effect transistor 12' be used.

In FIG. 3, a configuration 10 of the type previously described in connection with FIG. 1 is used to withdraw a current $I_C$ from the input circuit of a current amplifier 20 comprising first and second component transistors 201 and 202. Current amplifier 20, like current amplifier 15, has a large output impedance compared to the circuitry to which its output circuit is coupled and has a current gain of $-m$. Besides current amplifier 20, utilization means 14 includes a common-emitter amplifier transistor 21 provided a quiescent base current $mI_C/h_{fe}$ from the output circuit of current amplifier 15 and provided a quiescent collector current $mI_C$ from the output circuit of current amplifier 20. Transistors 13 and 21 have matched common-emitter forward current gains of $h_{fe}$. The quiescent base current $mI_C/h_{fe}$ applied to the base electrode of transistor 21 causes it to demand a quiescent collector current $h_{fe}$ times as large—i.e., a collector current of value $mI_C$. This demand for quiescent collector current is exactly met by the $mI_C$ current flowing from the output circuit of current amplifier 20.

Accordingly, output terminal 22 is at an indeterminant potential insofar as configuration 10 is concerned. The potential at output terminal 22 will be stably determined by the potential of the source 23 to which it is direct current conductively coupled by its resistive load 24. Output signal potentials are developed at terminal 24 in response to variation of the collector current of transistor 21. This variation is caused by input signals supplied to the base electrode of transistor 21 from a signal source 25 via a coupling capacitor 26. These output signal potentials may range over the entire range of potentials provided by the serially connected potential sources 16, 111 minus the sum of the saturation potentials ($V_{SAT}$'s) of transistors 21 and 202, which sum generally is comparatively negligible. The range available for output signal swing is larger than that provided in the circuits shown in the previously mentioned application Ser. No. 302,866.

Biasing means 11 is shown in FIG. 3 as comprising potential source 111 and a resistor 112 used to determine the emitter current of transistor 13. In accordance with Ohm's Law, this emitter current is the potential $V_m$ provided by source 111 minus the base-emitter junction offset potentials ($V_{BE}$'s) of transistors 12 and 13, all divided by the resistance of resistor 112. The emitter current of a transistor is well known to be equal to the sum of its base and collector currents. The emitter current of transistor 13 is therefore equal to the base current $I_C/h_{fe}$ plus its collector current $I_C$—that is, equal to $I_C$ times the factor $(h_{fe}+1)/h_{fe}$. For normal values of $h_{fe}$ (greater than 30 or 50) the base current is so much smaller than the collector current that the former may be ignored and the collector current $I_C$ of transistor 13 may be said to be substantially equal to its emitter current.

Figure 4:
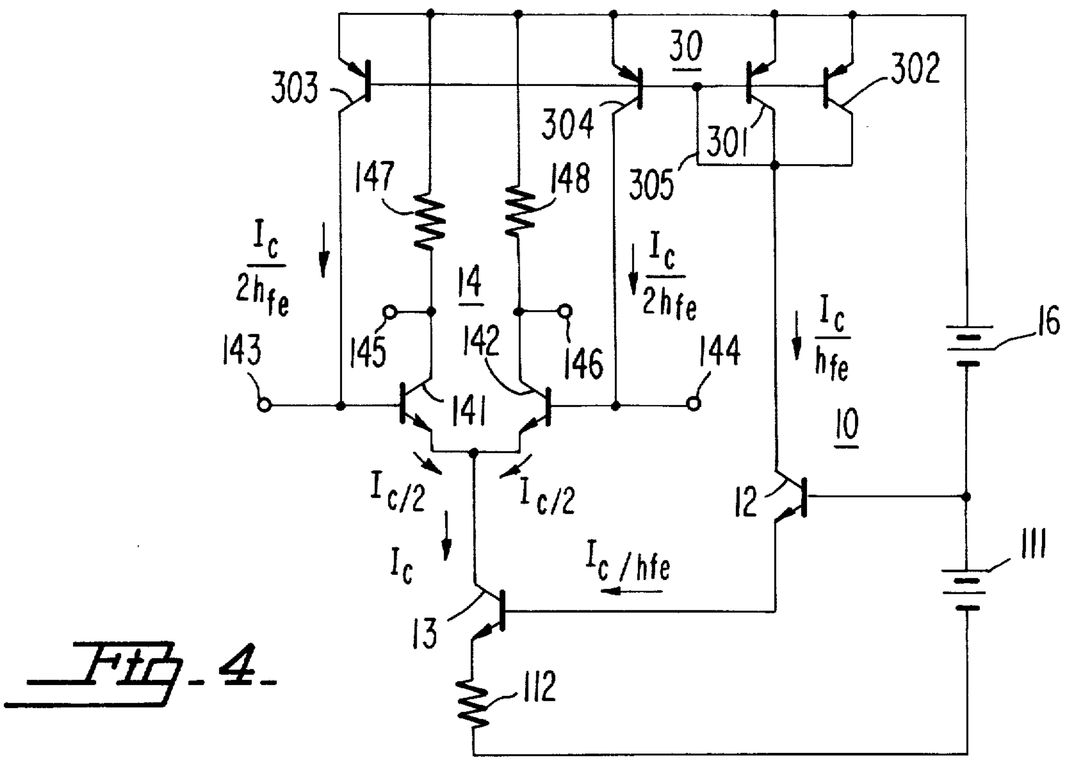
FIGS. 4, 5, 6 and 7 are schematic diagrams of "long-tailed-pair" differential amplifiers using different, alternative translation networks of the type shown in FIG. 1 to compensate the base current demands of the emitter-coupled transistors included therein, according to further aspects of the invention.

In FIG. 4, utilization means 14 is an emitter-coupled differential amplifier comprising transistors 141 and 142 having their base electrodes respectively connected to input signal terminals 143 and 144, having their collector electrodes respectively connected to output signal terminals 145 and 146, and having their emitter electrodes coupled to the collector electrode of transistor 13 by similar means. These similar means are shown in FIG. 3 as comprising direct connections but may alternatively comprise resistive elements. Transistors 141, 142 and 13 have tracking $h_{fe}$ characteristics. Transistor 13 withdraws constant current from the coupled emitters of transistors 141, 142 to establish their combined emitter currents. The collector current $I_C$ of transistor 13 is withdrawn half from the emitter electrode of transistor 141 and half from the emitter electrode of transistor 142 when the input signals applied to input terminals 143 and 144 are equal in potential.

Transistors 145 and 146 are shown as being provided resistive collector loads 147 and 148, respectively, although alternative means of loading are available. Active collector loads provided by the collector circuits of PNP transistors may be used, for example, the PNP transistors being biased for constant collector current or, alternatively, being connected to form a current inverting amplifier to convert balanced output signal to single-ended output signal.

The collector current $I_C$ of transistor 13 is supported by a base current flow $I_C/h_{fe}$ provided as emitter current from transistor 12. The collector current withdrawn by transistor 12 from the input circuit of a current mirror 30 is substantially equal to its emitter flow (i.e., closely approximates $I_C/h_{fe}$), supposing its common-emitter current gain to be the normal value, greater than 30 or so. The current amplifier 30 is shown as comprising four matched transistors 301, 302, 303 and 304 with parallelled base-emitter junctions. Since their base emitter potentials are alike and since they have matched operating characteristics, transistors 301, 302, 303 and 304 have essentially identical collector currents. Transistors 301 and 302 are connected in parallel having their collector-to-emitter paths as well as their base-emitter junctions parallely connected and are provided with collector-to-base degenerative feedback which regulates their combined equal collector currents—together with the combined base currents of transistors 301, 302, 303 and 304—to be equal to the $I_C/h_{fe}$ collector current demanded by transistor 12.

The combined base currents of transistors 301, 302, 303 and 304 can be made to contribute only a negligible portion of the $I_C/h_{fe}$ collector current demanded by transistor 12. This may be done by selecting PNP transistors 301, 302, 303 and 304 to have high common-emitter forward current gain or alternatively where such PNP transistors are unavailable, by providing the collector-to-emitter feedback 305 by means of an emitter-follower transistor rather than by direct connection as shown in FIG. 3. When one of these procedures is followed, the combined equal collector currents of transistors 301 and 302 will substantially equal $I_C/h_{fe}$. Each of the collector currents of transistors 301, 302, 303 and 304 will then be substantially equal to $I_C/2h_{fe}$. That is, current amplifier 30 has a current gain of one-half between its input circuit and each of its output circuits.

The $I_C/2h_{fe}$ collector currents supplied from transistors 303 and 304 to the base electrodes of transistors 141 and 142, respectively, suffice to support quiescent emitter current levels of $I_C/2$ in each of the transistors 141 and 142, respectively. This means that essentially no current needs to be supplied via terminals 143 and 144 to support the quiescent emitter currents of transistors 141 and 142, when equal quiescent potentials are applied to terminals 143 and 144. This is so even if the $h_{fe}$'s of transistors 141, 142 and 13 change because of temperature changes affecting them similarly.

Since there is no demand for quiescent base current for transistors 141 and 142 which demand would have to be supplied via terminals 143 and 144, there is no appreciable input offset potential error required to be developed in response to this demand in the preceding circuitry which is coupled to terminals 143 and 144. This is so even if this preceding circuitry should display a relatively high source resistance. The possibility of response to such error appearing at the output terminals 145 and 146, which might otherwise occur despite the inherent common-mode error rejection capabilities of the emitter-coupled differential amplifier formed with transistors 141 and 142, is therefore avoided by the described use of the invention.

Figure 5:
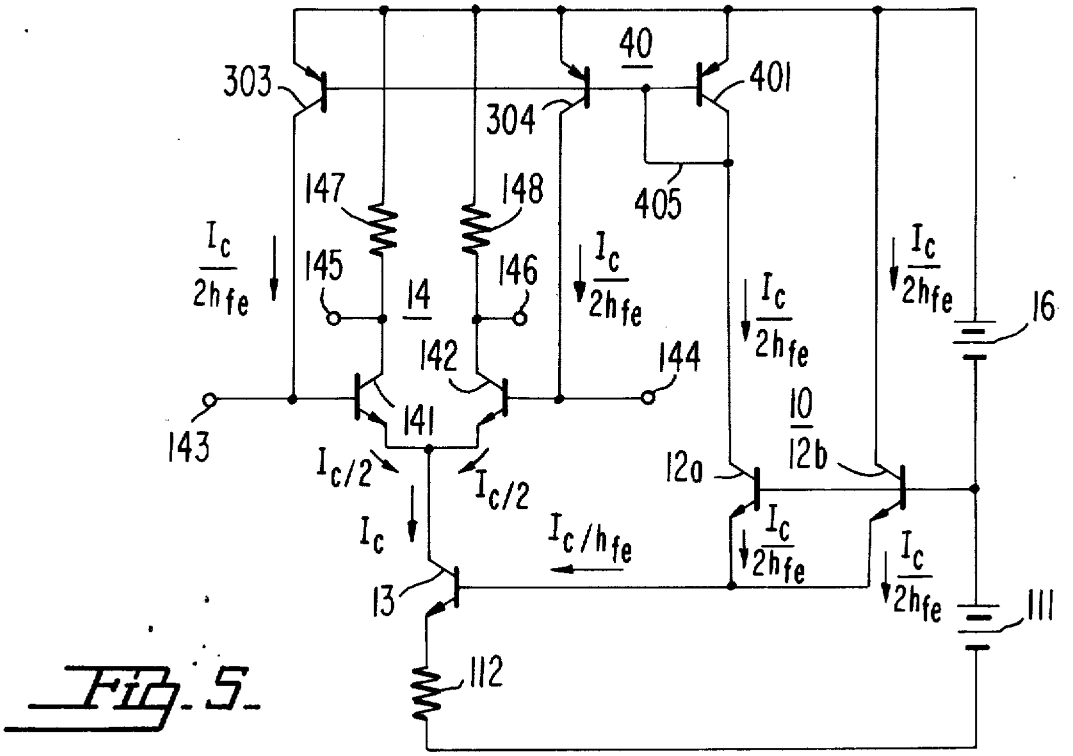

FIG. 5 shows an alternative configuration to that shown in FIG. 4. The current amplifier 40 has unity current gain between its input circuit and each of its output circuits. The input circuit of amplifier 40 is coupled to supply the collector current required by transistor 12*a*, and its output circuits coupled to supply the quiescent base currents respectively required by transistor 141 and by transistor 142. To supply the $I_C/2h_{fe}$ quiescent base currents required by transistors 141 and 142, a $I_C/2h_{fe}$ current is withdrawn from the input circuit of current amplifier 40 is response to the $I_C/h_{fe}$ base current of transistor 13. This means the current gain of the circuitry coupling the base of transistor 13 to the input circuit of current amplifier 40 must be one-half.

The current gain of one-half is obtained in the following way. The base-emitter junction of transistor 12*a* is connected in parallel with the base-emitter junction of a transistor 12*b*. Transistor 12*b* has a transconductance characteristic matching that of transistor 12*a*. Therefore, half the base current of transistor 13 is provided by the emitter current of transistor 12*a* and the other half, by the emitter current of transistor 12*b*. Only the collector current of transistor 12*a*, which is substantially equal to its emitter current for transistors having normal $h_{fe}$, is withdrawn from the input circuit of current amplifier 40.

Embodiments in which the relative transconductances of transistors 12*a* and 12*b* are other than equal and the current gain of current amplifier 40 is correspondingly adjusted to provide an overall quiescent current gain of $1/2h_{fe}$ in the current translation network 10 linking the emitter and the base electrodes of transistors 141 and 142 are possible also.

Figure 6:
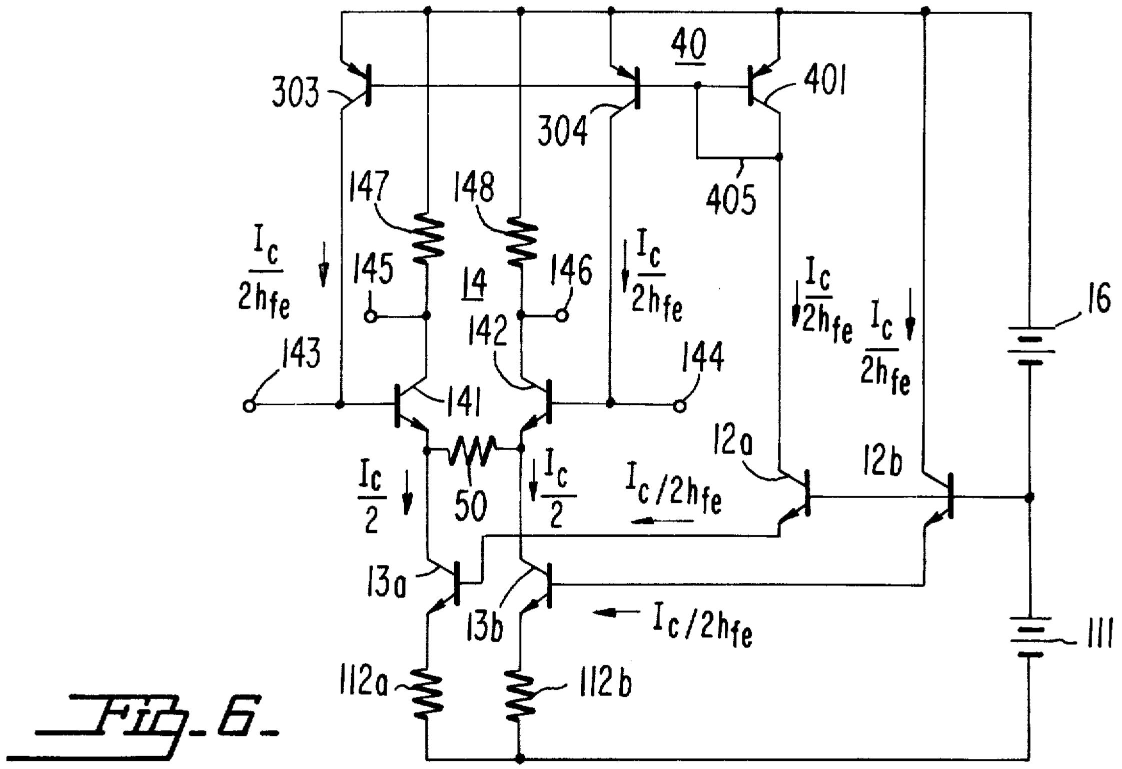

FIG. 6 shows another method of getting overall quiescent current gains $1/2h_{fe}$ in the current translation network linking the coupled emitter electrodes of differential amplifier transistors 141, 142 to each of their base electrodes. Transistor 13 is replaced by transistors 13*a* and 13*b*, each arranged to have equivalent base-emitter circuitry whereby each supplies one-half of the required $I_C$ combined emitter currents of transistors 141 and 142. Transistors 13*a* and 13*b* have matching $h_{fe}$ characteristics with each other and with transistors 141 and 142. The base currents of transistors 13*a* and 13*b* are $1/h_{fe}$ times as large as their collector currents. By common-base amplifier action the base currents of transistors 13*a* and 13*b* cause collector currents $I_C/2h_{fe}$ to be demanded by transistors 12*a* and 12*b* just as are demanded in the FIG. 4 circuit. The separate emitter degeneration resistors 112*a* and 112*b* in the emitter circuits of transistors 13*a* and 13*b*, respectively, help match the currents in transistors 12*a* and 13*a* to those in transistors 12*b* and 13*b*.

The FIG. 6 configuration is advantageous in that linearization of the differential amplifier formed by transistors 141 and 142 can be accomplished by a single resistor 50 coupling their emitters as shown. This resistor will have no quiescent current flow therethrough when the quiescent potentials applied to input terminals 143 and 144 are equal and therefore will have no quiescent offset potential developed thereacross, which offset potential might otherwise derogate from available signal potential swing. Resistor 50 may be replaced by direct connection if higher differential amplifier gain is more important in a specific application than linearity of gain.

Figure 7:
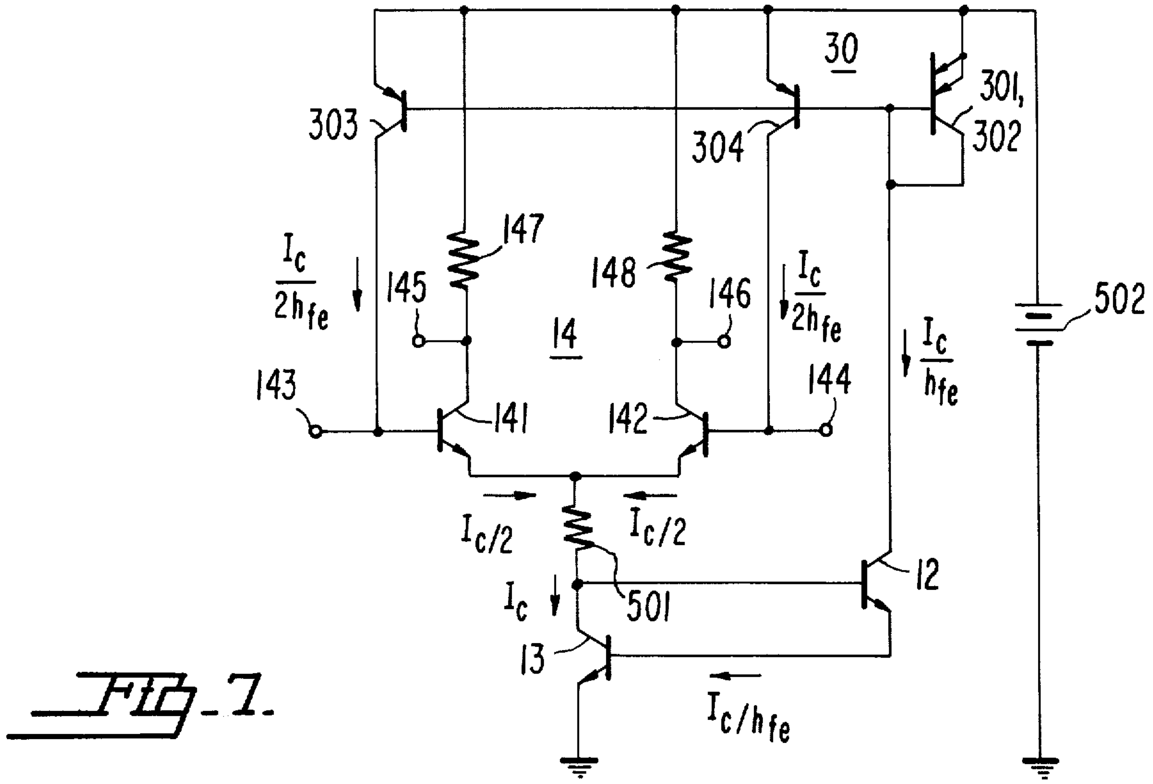

FIG. 7 shows an emitter-coupled differential amplifier 14 in which the joined emitter electrodes of transistors 141, 142 are connected to reference potential (ground) by resistive means rather than by a constant current supply. Transistor 13 is provided with collector-to-base feedback via the base-emitter junction of transistor 12, which regulates the collector-to-emitter potential of transistor 13 to equal the sum of the base-emitter offset potentials of transistors 12 and 13—that is, to equal $V_{BE12} + V_{BE13}$. $V_{BE12} + V_{BE13}$ is well-defined over a wide range of collector current levels of transistor 13 and will remain about 1.2 – 1.3 volts for silicon devices. The collector of transistor 13 will exhibit a source impedance equal to the reciprocal of its transconductance, which transconductance is 30 millimhos per milliampere of its emitter current. Under normal circumstances, this source impedance will be smaller than the resistance of the resistor 501 used to connect the joined-emitter electrodes of transistor 141 and 142 to the substantial constant potential provided at the collector electrode of transistor 13.

The transistors 12 and 13 are self biased by feedback in the FIG. 7 circuit. Since the base current $I_{B12}$ of transistor 12 is smaller than $I_C$ by the product of the $h_{fe}$'s of transistor 12 and 13, which product normally exceeds 1000, $I_{B12}$ is negligibly compared to $I_C$. Therefore, the combined emitter currents of transistors 141 and 142 which flow through resistor 501 will be substantially equal to $I_C$. The quiescent value of $I_C$ is determined by the average bias potential $V_{BIAS}$ applied to terminals 143 and 144 minus the quiescent base-emitter offset potential of transistor 143 and 144 minus ($V_{BE12} + V_{BE13}$) all divided by the resistance $R_{501}$ of resistor 501, in accordance with Ohm's Law. The feedback loop connection of transistors 12 and 13 in essence is a circuit which receives an input current supplied to it (in this case, via resistor 501) and responds to that input current to provide an output current proportionally related thereto by a factor which is the reciprocal of the common-emitter forward current gain of a transistor—that is, a factor equal to $h_{fe}$.

The circuit of FIG. 7 resembles the FIG. 4 circuit in most respects other than transistors 12 and 13 being self-biasing rather than accepting fixed bias. Since no fixed bias need be applied to the base electrode of transistor 12 separate voltage supplies 16 and 111 are no longer needed and may be replaced by a single voltage supply 502, as shown. Transistors 301 and 302 are shown as sharing in common the same collector region.

Modifications of the FIG. 7 circuit can be made which are analgous to the modifications of the FIG. 4 circuit made in the FIGS. 5 and 6 circuits. If the base electrodes of transistors 141 and 142 are provided quiescent biasing from supplies providing $3V_{BE}$ potentials and the differential amplifier 14 is driven symmetrically by balanced signals applied to terminals 143 and 144, resistor 501 can be replaced by direct connection. $I_C$ will then be determined according to the defining equations of semiconductor junction action.

In the various configurations shown in FIGS. 1–7 transistor 13 may be a composite transistor formed by a plurality of transistors connected in Darlington cascade. Such arrangement is appropriate where the transistor (21, 141, 142) being supplied biasing coupled from the collector electrode of transistor 12 is a similar composite transistor.

What is claimed is:

1. In combination:

first and second transistors of the same conductivity type, each having a base and an emitter electrode with a base-emitter junction therebetween, each having a collector electrode;

means for direct current conductively coupling said first transistor emitter electrode to said second transistor base electrode so a fixed portion of said second transistor base current will flow as said first transistor emitter current;

means for providing forward bias to the base-emitter junctions of said first and said second transistors, said means being connected between said first transistor base electrode and said second transistor emitter electrode;

a first current amplifier having an input circuit connected to said first transistor collector electrode, having an output circuit, and having an inverting current transfer characteristic between its said input and said output circuits; and utilization means connected to said second transistor collector electrode and connected to said first current amplifier output circuit.

2. The combination set forth in claim 1 wherein said utilization means comprises:

a second current amplifier having an input circuit connected to said second transistor collector electrode, having an output circuit and having an inverting current transfer characteristic between its said input and said output circuits;

a third transistor of said same conductivity type having an emitter electrode, having a base electrode direct coupled to said first current amplifier output circuit, having a collector electrode direct coupled to said second current amplifier output circuit;

means for applying input signal between said base and said emitter electrodes of said third transistor; and means for coupling output signal responsive to said input signal from said third transistor collector electrode.

3. The combination set forth in claim 2 wherein:

said means for direct current conductively coupling said first transistor emitter electrode to said second transistor base electrode is essentially the exclusive direct current conductive coupling to those electrodes, whereby said fixed portion of said second transistor base current is substantially its entirety; and said current transfer characteristics of said first and said second current amplifiers are substantially equivalent to each other.

4. The combination set forth in claim 1 wherein said utilization means comprises:

a third transistor of said conductivity type having a base electrode direct coupled to said first current amplifier output circuit, having an emitter electrode direct coupled to said second transistor collector electrode, and having a collector electrode; and means for providing an operating potential to said third transistor collector electrode.

5. The combination set forth in claim 1 wherein said utilization means comprises:

third and fourth transistors of said conductivity type, each having base and emitter and collector electrodes, said emitter electrodes thereof being direct current conductively coupled to said second transistor collector electrode, said third transistor base electrode being direct current conductively coupled from said first current amplifier output circuit; and further means for completing the connection of said third and fourth transistors in emitter-coupled differential amplifier configuration.

6. The combination set forth in claim 5 wherein:

said means for direct current conductively coupling said first transistor emitter electrode to said second transistor base electrode is essentially the exclusive direct current conductive coupling to those electrodes, whereby said fixed portion of said second transistor base current is substantially its entirety; and said current transfer characteristic of said first current amplifier is substantially one-half over a frequency range including zero Hertz, which is to say direct current.

7. The combination set forth in claim 5 wherein said first current amplifier current transfer characteristic is substantially −1 over a frequency range including zero Hertz, which is to say direct current and wherein said utilization means includes:

a sixth transistor substantially identically similar to said first transistor, having base and emitter electrodes with a base-emitter junction therebetween and having a collector electrode;

means parallelly connecting the base-emitter junctions of said first and said sixth transistors to share current flow substantially equally between them;

means for connecting said sixth transistor collector electrode to an operating potential.

8. The combination set forth in claim 1 having third and fourth transistors of matching types respectively to said first transistor and to said second transistor, each having base and emitter electrodes with a base-emitter junction therebetween, each having a collector electrode;

means for direct current conductively coupling said third transistor emitter electrode to said fourth transistor base electrode in like manner as said first transistor emitter electrode is direct current conductively coupled to said second transistor base electrode by said means for so doing;

means for providing forward bias to the base-emitter junctions of said third and said fourth transistors in like degree as provided to the base-emitter junctions of said first and said fourth transistors by said means for so doing; and means for connecting the collector electrodes of said third and said fourth transistors to an operating potential and to said utilization means, respectively.

9. The combination claimed in claim 8 wherein said utilization means comprises:

fifth and sixth transistors having current transfer characteristics respectively matching those of said second and said fourth transistors, each having base and emitter and collector electrodes, said emitter electrodes of said third and said fourth transistors being coupled to each other and being direct current conductively coupled respectively to separate ones of the collector electrodes of said second and said fourth transistors, said fifth transistor base electrode being direct-current conductively coupled from said first current amplifier output circuit; and further means for completing the connection of said third and fourth transistors in emitter-coupled differential-amplifier configuration.

10. In combination with an emitter-coupled differential amplifier including first and second and third transistors, each having base and emitter electrodes with a base-emitter junction therebetween, each having a collector electrode and a collector-base junction between its said collector and base electrodes; means for direct current conductively coupling each of the emitter electrodes of said first and said second transistors to said third transistor collector electrode; means for forward biasing said third transistor base-emitter junction coupled thereto; first and second input terminals for receiving an input signal therebetween, which terminals are respectively coupled to the base electrodes of said first and said second transistors; means for forward biasing the base-emitter junctions of said first and said second transistors and for reverse biasing the collector-base junction of said third transistor, coupled between said third transistor emitter electrode and each of the base electrodes of said first and said second transistors; means for reverse biasing the collector-base junctions of each of said first and said second transistors and for providing an impedance across which is developed an output signal responsive to collector current variations of at least one of said first and said second transistors as caused by said input signal, said means being connected between the collector electrodes of said first and said second transistors, the improvement comprising:

means coupled to the base electrode of said third transistor and responsive to the flow of base current in said third transistor, for producing a response current proportional to said third transistor base current by a constant of proportionality; and inverting amplifier means having an input circuit to which said response current is supplied, having an output circuit connected to said first transistor base electrode, and having a current gain therebetween which is one half times as large as the reciprocal of said constant of proportionality.

11. The combination set forth in claim 10 wherein said means for forward biasing said third transistor base-emitter junction coupled thereto and said means responsive to the flow of base current in said third transistor together comprise:

a fourth transistor having a principal conduction path between first and second electrodes connected respectively to said third transistor base electrode and to said input circuit of said inverting current amplifier means, having a control electrode, being responsive to potential appearing between its control and first electrodes to have the conductance of said principal conduction path determined and thereby give rise to potential follower action between said control and said first electrodes, and means for providing a potential applied between said fourth transistor control electrode and said third transistor emitter electrode, which potential is of a polarity to forward bias said third transistor base-emitter junction.

12. The combination set forth in claim 11 wherein said fourth transistor is a bipolar type having base, emitter and collector electrodes corresponding to said control, said first and said second electrodes, respectively.

13. The combination set forth in claim 11 wherein said fourth transistor is a field-effect type having a gate, a source and a drain electrodes corresponding to said control, said first and said second electrodes, respectively.

14. The combination set forth in claim 11 wherein said means for forward biasing said third transistor base-emitter junction coupled thereto and said means responsive to the flow of base current in said third transistor together further comprise:

a fifth transistor of the same type as said fourth transistor and matched in characteristics therewith, said fifth transistor having a principal conduction path between first and second electrodes and having a control electrode, the first and the control electrodes of said fifth transistor being connected to the corresponding electrodes of said fourth transistor, and means for supplying current connected between said fifth transistor second electrode and said third transistor emitter electrode.

15. In combination:

a first transistor of a first conductivity type having base and emitter and collector electrodes and having a common-emitter forward current gain of $h_{fe}$;

a second transistor of said first conductivity type having a control electrode and having a principal conduction path between first and second electrodes, the conductance of said principal conduction path being controllable in response to potential applied between said control and said first electrodes, said control electrode of said second transistor being connected to said first transistor collector electrode;

direct current conductive means connected between the first electrode of said second transistor and the base electrode of said first transistor, said direct current conductive means being the sole direct current conductive means of substantial effect connected either to the first electrode of said second transistor or to the base electrode of said first transistor;

means connected to said first transistor collector electrode for supplying an input current thereto; and means for utilizing an output current applied thereto from said second electrode of said second transistor, which output current is proportional to said input current by a factor $1/h_{fe}$.

16. The combination set forth in claim 15 wherein said means for utilizing an output current applied thereto comprises:

a third transistor of said first conductivity type having a base and an emitter and a collector electrodes and having a common-emitter forward current gain of $h_{fe}$;

a first current amplifier having an input circuit to which said second electrode of said second transistor is connected, having an output circuit to which said third transistor base electrode is connected and having an inverting current transfer characteristic between its said input and said output circuits, a resistor connecting said third transistor emitter electrode to said first transistor collector electrode being included in said means for supplying an input current; and means further connecting said third transistor as an amplifier connected to the base, emitter and collector electrodes of said third transistor.

17. In combination:

first and second transistors of the same conductivity type, each having a base and an emitter electrodes with a base emitter junction therebetween each having a collector electrode;

means for direct current conductively coupling said first transistor emitter electrode to said second transistor base electrode so a fixed portion of said second transistor base current will flow as said first transistor emitter current;

means connecting said first transistor base electrode to said second transistor collector electrode;

means for applying a biasing current to said second transistor collector electrode;

a first current amplifier having an input circuit connected to said first transistor collector electrode, having an output circuit, and having an inverting current transfer characteristic between its said input and said output circuits; and utilization means connected to said second transistor collector electrode and connected to said first current amplifier output circuit.

18. The combination set forth in claim 17 wherein said utilization means comprises:

a second current amplifier having an input circuit connected to said second transistor collector electrode, having an output circuit and having an inverting current transfer characteristic between its said input and said output circuits;

a third transistor of said same conductivity type, having an emitter electrode, having a base electrode direct coupled to said first current amplifier output circuit, and having a collector electrode direct coupled to said second current amplifier output circuit;

means for applying input signal between said base and said emitter electrodes of said third transistor; and means for coupling output signal responsive to said input signal from said third transistor collector electrode.

19. The combination set forth in claim 18 wherein:

said means for direct current conductively coupling said first transistor emitter electrode to said second transistor base electrode is essentially the exclusive direct current conductive coupling to those electrodes, whereby said fixed portion of said second transistor base current is substantially its entirety; and said current transfer characteristics of said first and said second current amplifiers are substantially equivalent to each other.

20. The combination set forth in claim 17 wherein said utilization means comprises:

a third transistor having a base electrode direct coupled to said first current amplifier output circuit, having an emitter electrode direct coupled to said second transistor collector electrode, and having a collector electrode; and means for providing an operating potential to said third transistor collector electrode.

21. The combination set forth in claim 17 wherein said utilization means comprises:

third and fourth transistors of said same conductivity type, each having a base and an emitter and a collector electrodes, said emitter electrodes thereof being direct current conductively coupled to said second transistor collector electrode, said third transistor base electrode being direct current conductively coupled from said first current amplifier output circuit; and further means for completing the connection of said third and said fourth transistors in emitter-coupled differential amplifier configuration.

22. In combination:

first and second transistors, each having base and emitter electrodes with a base-emitter junction therebetween and each having a collector electrode;

a third transistor having a principal conduction path between first and second electrodes, and having a control electrode whereby the conductances of said principal conduction path is controlled in response to potential appearing between said control and said first electrode to cause the potential at said first electrode to follow the potential at said control electrode, said first electrode being connected to said first transistor base electrode;

means for providing a biasing potential connected between said third transistor control electrode and said first transistor emitter electrode, said biasing potential being of such polarity as to cause base current flow in said first transistor;

a first inverting current amplifier having an input circuit to which said third transistor second electrode is connected and having an output circuit to which said second transistor base electrode is connected;

a direct current conductive coupling of said first transistor collector electrode to said second transistor emitter electrode; and means for providing an operating potential connected between said first transistor emitter electrode and said second transistor collector electrode.

23. In combination:

first and second transistors, each having base and emitter electrodes with a base-emitter junction therebetween and each having a collector electrode;

a third transistor having a principal conduction path between first and second electrodes, and having a control electrode whereby the conductance of said principal conduction path is controlled in response to potential appearing between said control and said first electrode to cause the potential at said first electrode to follow the potential at said control electrode, said first electrode being connected to said first transistor base electrode;

means for providing a biasing potential between said third transistor control electrode and said first transistor emitter electrode, said biasing potential being of such polarity as to cause base current flow in said first transistor;

a first inverting current amplifier having an input circuit to which said third transistor second electrode is connected and having an output circuit to which said second transistor base electrode is connected; and a second inverting current amplifier having an input circuit to which said first transistor collector electrode is connected and having an output circuit to which said second transistor collector electrode is connected.

24. In combination:

first and second transistors, each having base and emitter electrodes with a base-emitter junction therebetween and each having a collector electrode;

a third transistor having a principal conduction path between first and second electrodes, and having a control electrode whereby the conductance of said principal conduction path is controlled in response to potential appearing between said control electrode and said first electrode to cause the potential at said first electrode to follow the potential at said control electrode, said control electrode being connected to said first transistor collector electrode, said first electrode being connected to said first transistor base electrode;

a first inverting current amplifier having an input circuit to which said third transistor second electrode is connected and having an output circuit to which said second transistor base electrode is connected;

a direct current conductive coupling of said first transistor collector electrode to said second transistor emitter electrode; and means for providing an operating potential connected between said first transistor emitter electrode and said second transistor collector electrode.

25. The combination set forth in claim 24 wherein said direct current conductive coupling of said first transistor collector electrode to said second transistor electrode comprises:

a resistive element connecting said second transistor emitter electrode to said first transistor collector electrode.

* * * * *

UNITED STATES PATENT OFFICE
CERTIFICATE OF CORRECTION

PATENT NO. : 3,891,935

DATED : June 24, 1975

INVENTOR(S) : Allen LeRoy Limberg

It is certified that error appears in the above-identified patent and that said Letters Patent are hereby corrected as shown below:

Column 1, line 53, "inventin" should read --invention--.

Column 2, line 26, "by" should read --be--.

Column 9, line 13, "one-half" should read -- -1/2 -- or --minus one-half--.

Signed and Sealed this

*sixteenth* Day of *March 1976*

[SEAL]

*Attest:*

RUTH C. MASON
*Attesting Officer*

C. MARSHALL DANN
*Commissioner of Patents and Trademarks*